(12) United States Patent
Schroeder

(10) Patent No.: US 8,663,877 B2
(45) Date of Patent: Mar. 4, 2014

(54) LITHOGRAPHY MASKS, SYSTEMS, AND MANUFACTURING METHODS

(75) Inventor: Uwe Paul Schroeder, Lake Carmel, NY (US)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 13/406,301

(22) Filed: Feb. 27, 2012

(65) Prior Publication Data

US 2012/0155608 A1 Jun. 21, 2012

Related U.S. Application Data

(62) Division of application No. 12/471,695, filed on May 26, 2009, now Pat. No. 8,153,335.

(51) Int. Cl.
*G03F 9/00* (2006.01)
*G03F 7/00* (2006.01)

(52) U.S. Cl.
USPC .................................. 430/5; 430/394; 430/22

(58) Field of Classification Search
USPC ................... 430/5, 30, 311, 394; 250/492.22; 716/55
See application file for complete search history.

(56) References Cited

U.S. PATENT DOCUMENTS

| | | | |
|---|---|---|---|
| 4,758,863 A * | 7/1988 | Nikkel | ............................. 355/40 |
| 6,399,283 B1 | 6/2002 | Hoshi | |
| 7,310,129 B2 | 12/2007 | Stäcker et al. | |
| 2003/0039893 A1 | 2/2003 | Farnsworth et al. | |
| 2004/0029024 A1 | 2/2004 | Ohnuma | |
| 2007/0054198 A1 | 3/2007 | Park | |

FOREIGN PATENT DOCUMENTS

| | | |
|---|---|---|
| EP | 10344645 A1 | 5/2005 |
| EP | 1993120 A1 | 11/2008 |

OTHER PUBLICATIONS

Yamamoto, Y., et al., "Multi-layer reticle (MLR) strategy application to double-patterning/double-exposure for better overlay error control and mask cost reduction," Photomask Technology 2007, edited by Naber, R. J., et al., Proceeding of SPIE, 2007, pp. 67302X-1-67302X-12, vol. 6730.
Hazelton, A. J., et al., "Double patterning requirements for optical lithography and prospects for optical extension without double patterning," Optical Microlithography XXI, edited by Levinson, H. J., et al., Proceeding of SPIE, 2008, pp. 69240R-1-69240-13, vol. 6924.
Wiaux, V., et al., "Split and Design Guidelines for Double Patterning," Optical Microlithography XXI, edited by Levinson, H. J., et al., Proceeding of SPIE, 2008, pp. 692409-1-692409-11, vol. 692409.
Lee, S., et al., "An analysis of double exposure lithography options," Optical Microlithography XXI, Mar. 12, 2008, pp. 1-12, Proc. of SPIE vol. 6924, 69242A.

* cited by examiner

*Primary Examiner* — Stephen Rosasco
(74) *Attorney, Agent, or Firm* — Slater & Matsil, L.L.P.

(57) ABSTRACT

Lithography masks, lithography systems, methods of manufacturing lithography masks, methods of altering material layers of semiconductor devices, and methods of manufacturing semiconductor devices are disclosed. In one embodiment, a lithography mask includes a first pattern for at least one material layer of at least one die, the first pattern being oriented in a first position. The lithography mask includes a second pattern for at least one material layer of the at least one die, the second pattern being oriented in a second position. The second position is different than the first position.

24 Claims, 6 Drawing Sheets

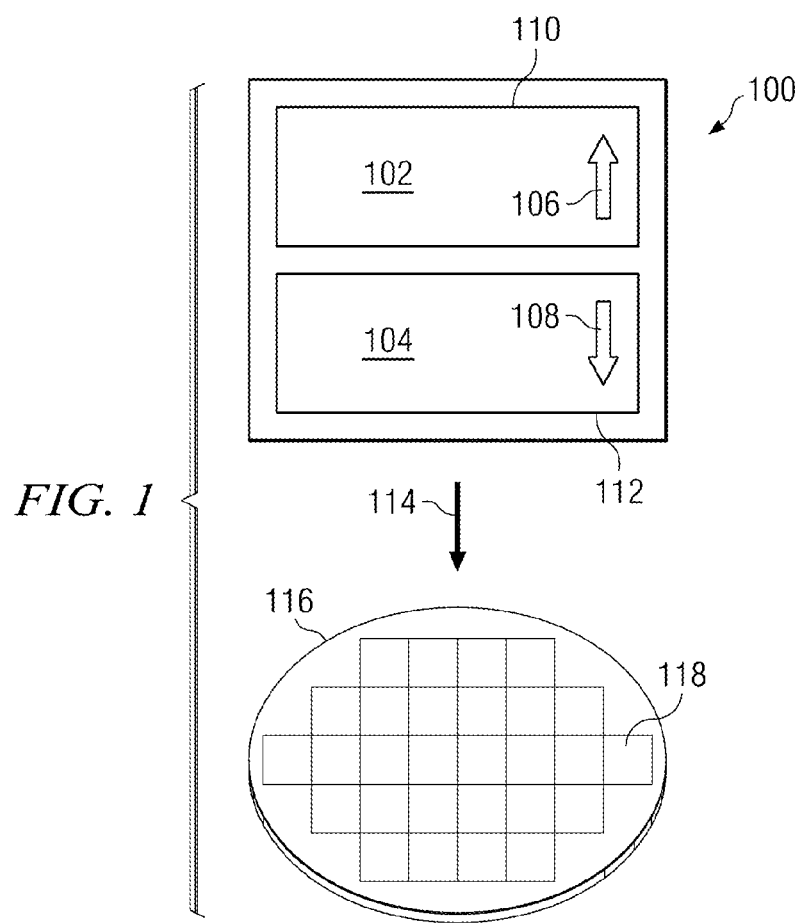
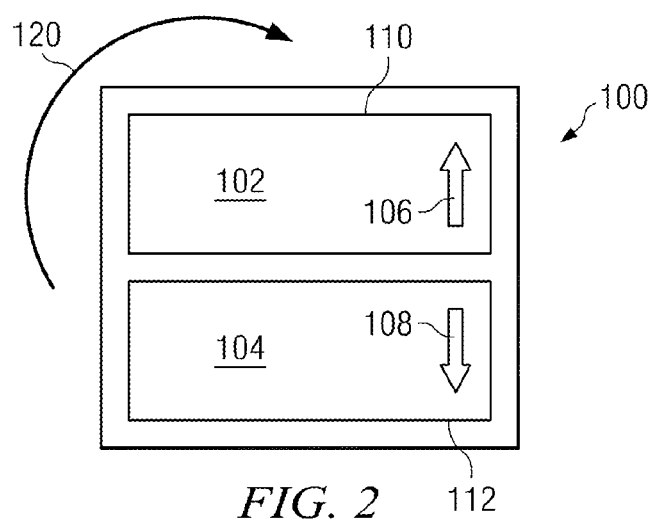

LITHOGRAPHY MASKS, SYSTEMS, AND MANUFACTURING METHODS

This is a divisional application of U.S. application Ser. No. 12/471,695, which was filed on May 26, 2009, and is incorporated herein by reference.

TECHNICAL FIELD

The present invention relates generally to semiconductor device fabrication, and more particularly to lithography masks, lithography systems, and manufacturing methods for semiconductor devices and lithography masks.

BACKGROUND

Semiconductor devices are used in a variety of electronic applications, such as personal computers, cell phones, digital cameras, and other electronic equipment, as examples. Semiconductor devices are typically fabricated by sequentially depositing several insulating or dielectric layers, conductive layers, and semiconductive layers of material over a semiconductor substrate, and patterning the various layers using lithography to form circuit components and elements thereon.

There is a trend in the semiconductor industry towards reducing the size of features, e.g., the circuits, elements, conductive lines, vias, and contacts of semiconductor devices, in order to improve the performance of the semiconductor devices, reduce power consumption, and meet smaller packaging requirements, for example. However, as feature sizes of semiconductor devices diminish, the patterning of features becomes more challenging. The transfer of patterns of lithography masks to semiconductor devices having small feature sizes may be inaccurate or unpredictable in some applications, for example.

Double patterning is a process that is used to print small minimum feature sizes of some semiconductor devices. In double patterning, a design for conductive lines is split into two layouts. Two lithography masks are used to print alternating conductive lines, so that each mask can be imaged with better contrast due to the relaxed pitch. A patterning process flow for double patterning typically includes exposing a first resist film with a first lithography mask, transferring an image of the first mask from the first resist film into a hard mask, and stripping the first resist film. A second resist film is recoated and exposed with a second lithography mask, and the second resist image from the second lithography mask is transferred into the hard mask. The hard mask is then used as an etch mask to pattern a material layer beneath the hard mask.

However, double patterning requires two lithography masks to print a single layer, and lithography masks used for semiconductor processing are expensive. One trend is the use of multi-layer reticles (MLRs) to reduce mask costs, particularly for low volume semiconductor products. Rather than using one photo layer per lithography mask, patterns for multiple layers are placed on a single lithography mask. The exposure field is divided into subsections, and respective areas of the lithography mask are shielded off in order to expose a single layer on a semiconductor wafer. MLRs may also be used for double patterning of a single layer, for example.

However, using MLRs causes considerable additional overlay contributions, thus decreasing yields and reliability of semiconductor devices. Lithographic steppers have a distinct overlay placement signature due to lens aberrations and reticle stage distortions, for example. Likewise, when using MLRs with lithography scanners, there are similar reticle stage distortion effects.

Thus, what are needed in the art are improved lithography masks, lithography systems, and methods of manufacturing lithography masks and semiconductor devices.

SUMMARY OF THE INVENTION

These and other problems are generally solved or circumvented, and technical advantages are generally achieved, by embodiments of the present invention, which provide novel lithography masks, lithography systems, and manufacturing methods.

In accordance with one embodiment of the present invention, a lithography mask includes a first pattern for at least one material layer of at least one die, the first pattern being oriented in a first position. The lithography mask includes a second pattern for at least one material layer of the at least one die, the second pattern being oriented in a second position. The second position is different than the first position.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a lithography mask including a first pattern and a second pattern in accordance with an embodiment of the present invention that is first used to alter a material layer of a semiconductor device with the first pattern;

FIG. 2 illustrates rotating the lithography mask to reposition the second pattern of the lithography mask;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 3:
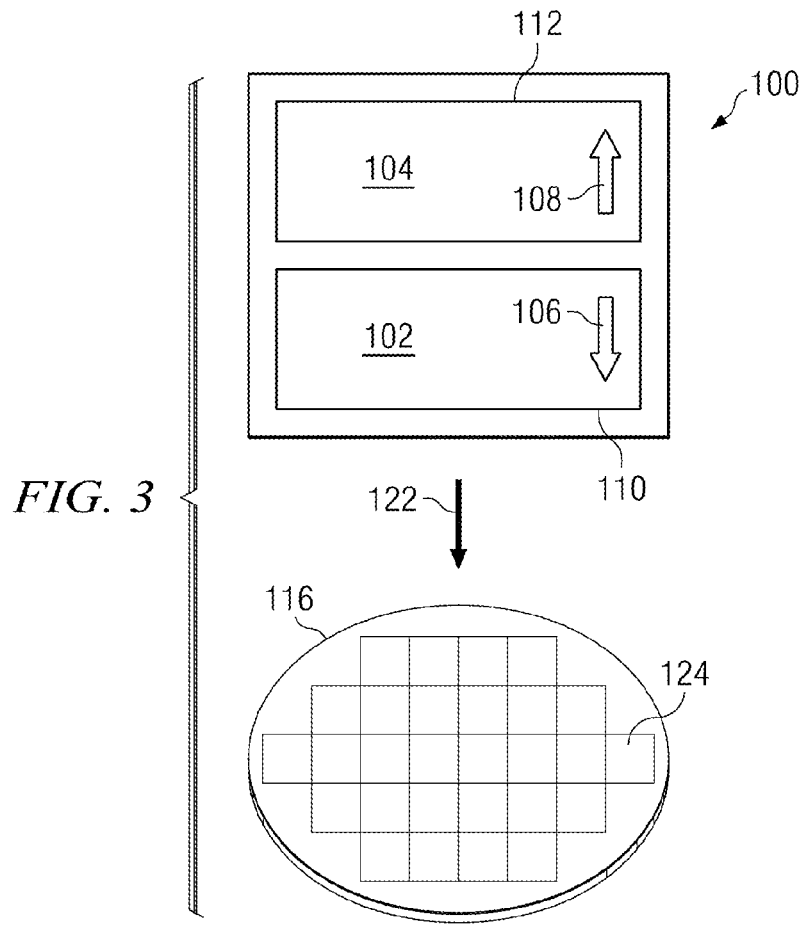
FIG. 3 shows the lithography mask being used to alter a material layer of the semiconductor device with the second pattern after rotating the lithography mask.

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Embodiments of the present invention provide novel lithography masks and systems that may be used to alter material layers of semiconductor devices. Multiple patterns on a lithography mask are oriented differently so that the lithography mask may be rotated between exposures or material layers, ensuring that the same region of the lens of the lithography system and the same region of the lithography and wafer stage of the exposure tool are used for all exposures, thereby suppressing tool overlay signatures.

FIG. 1 shows a lithography mask 100 in accordance with an embodiment of the present invention. The lithography mask 100 includes a first pattern 102 and a second pattern 104. The first pattern 102 may comprise a pattern for at least one material layer 118 of at least one die of a semiconductor device 116 or wafer, for example. The first pattern 102 is oriented in a first position 106 or a first orientation. The top 110 of the first pattern 102 is closest to the upper edge of the lithography mask 100 in the example shown.

The second pattern 104 may comprise a pattern for at least one material layer 124 of at least one die (see FIG. 3) of a semiconductor device 116 or wafer. The second pattern 104 is oriented in a second position 108 or a second orientation. The top 112 of the second pattern 104 is closest to the lower edge of the lithography mask 100 in the example shown in FIG. 1. The second position 108 is different than the first position 106. In the embodiment shown in FIGS. 1 through 3, the second position 108 of the second pattern 104 is oriented upside-down relative to the first position 106 of the first pattern 102 on the lithography mask 100, so that when the lithography mask 100 is rotated, the second position 108 of the second pattern 104 is oriented right-side up, for example.

The second pattern 104 oriented in the second position 108 may be oriented on the lithography mask 100 about 180 degrees from the first position 106 of the first pattern 102, for example. In some embodiments, the second pattern 104 may be oriented on the lithography mask 100 substantially 180 degrees from the first position 106 of the first pattern 102, to achieve rotational symmetry of the mask 100.

One or more material layers of the semiconductor device 116 may be patterned using the first pattern 102 or the second pattern 104 of the mask 100. As one example, first, a material layer of the semiconductor device 116 may be altered using the first pattern 102 of the lithography mask 100, using an exposure process 114, as shown in FIG. 1. A stepper or scanner may be used to expose a material layer 118 of a plurality of die, transferring the first pattern 102 to the material layer 118 of the semiconductor device 116. A layer of photoresist (not shown) may be formed over the material layer 118 of the semiconductor device 116, and the first pattern 102 is transferred to the layer of photoresist, for example. The layer of photoresist is then developed, and the underlying material layer 118 is altered or affected using the layer of photoresist as a mask, for example.

In the example shown in FIGS. 1 through 3, the first pattern 102 comprises an upper portion of the lithography mask 100 that is in a first position 106 during the first exposure 114. The second pattern 104 may be bladed or covered by an opaque material during the first exposure 114, for example. The first pattern 102 is in the first position 106 that is 'upright' during the first exposure 114.

After the first exposure process 114, the lithography mask 100 is rotated, as shown in FIG. 2 at 120, to position the second pattern 104 so that the second pattern 104 is in the same relative position that the first pattern 102 was in during the first exposure process 114. The lithography mask 100 is rotated by about 180 degrees in the example shown in FIGS. 1 through 3, positioning the second pattern 104 at the top of the lithography mask 100, in the 'upright' position. The second position 108 after the rotation 120 comprises substantially the same position and orientation spatially as the first position 106 of the first pattern 102 in the first exposure 114, as shown in FIG. 3, e.g., with respect to the lithography system (see FIG. 8, to be described further herein) used during the first exposure process 114. Rotating the lithography mask 100 positions the second pattern 104 in the first position 106 relative to a pattern formed on the affected material layer 118 (e.g., from the first exposure process 114 using the first pattern 102) of the semiconductor device 116.

The second pattern 104 is then used to alter or affect a material layer 124 of the semiconductor device 116 with the second pattern 104 after rotating the lithography mask 100, as shown in FIG. 3. The second pattern 104 may be used to alter the same material layer during the second exposure process 122 that was altered during the first exposure process 114, e.g., using the same layer of photoresist or by stripping the first layer of photoresist and applying a new layer of photoresist that is then patterned with the second pattern 104. Alternatively, the second pattern 104 of the lithography mask 100 may be used to alter a different material layer 124 during the second exposure process 122 than the first material layer 118 that was altered during the first exposure process 114, forming or patterning a second material layer 124 of a plurality of die, as shown.

Because the lithography mask 100 includes multiple patterns, the number of lithography masks required to manufacture the semiconductor device 116 is reduced, resulting in a cost savings. Because the second pattern 104 is inverted or oriented in a second position 108 that is different than the first position 106 of the first pattern 102, rotating the mask 100 between the two exposures 114 and 122 results in the same region of the lithography system lens, the same region of the support or stage for the lithography mask 100, and the same region of the support or stage for the semiconductor device 116 being used during the exposures 114 and 122, which results in reduced overlay signatures, advantageously.

The top portion of the lithography mask 100 is used while the lower portion is bladed or covered by an opaque material during the first exposure 114 and the second exposure 122, and the first pattern 102 or second pattern 104 is rotated into the top position relative to the other portions of the lithography system for the exposures 114 and 122. Alternatively, the lower portion of the lithography mask 100, or a side of the lithography mask 100, may be selected and used during the first exposure 114 and the second exposure 122 while other portions of the lithography mask 100 are covered, for example.

Embodiments of the present invention are also implementable in lithography masks 100 that include three or more patterns 102 and 104. For example, FIGS. 4 through 7 illustrate an embodiment wherein the lithography mask 100 includes a first pattern 102, a second pattern 104a, a third pattern 104b, and a fourth pattern 104c. The fourth pattern 104c may not be included on the lithography mask 100 in some embodiments, for example, not shown. The second pattern 104a, the third pattern 104b, and the fourth pattern 104c are oriented in different positions 108a, 108b, and 108c or orientations, respectively that are different from one another and that are different from the first position 106 of the first pattern 102. The second pattern 104a is oriented in a second position 108a that is oriented on the lithography mask 100 about 90 degrees from the first position 106 of the first pattern 102, the third pattern 104b is oriented in a third position 108b that is oriented on the lithography mask 100 about 90 degrees from the second position 108a of the second pattern 104a, and the fourth pattern 104c is oriented in a fourth position 108c that is oriented on the lithography mask 100 about 90 degrees from the third position 108b of the third pattern 104b, for example. In some embodiments, the first pattern 102, second pattern 104a, third pattern 104b, and fourth pattern 104c are oriented in positions 106, 108a, 108b, and 108c, respectively, that are substantially 90 degrees apart, to achieve rotational symmetry for the mask 100. The mask 100 may be rotated and multiple exposures may be made using the mask 100 to pattern a single material layer or multiple material layers of a semiconductor device 116 using the same quadrant of the mask 100.

Figure 4:
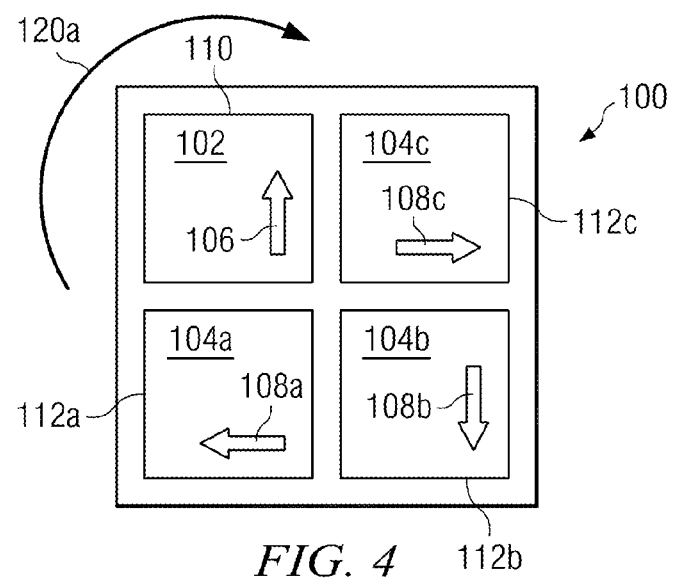
FIG. 4 illustrates a lithography mask that includes four patterns in accordance with another embodiment of the present invention.
Figure 5:
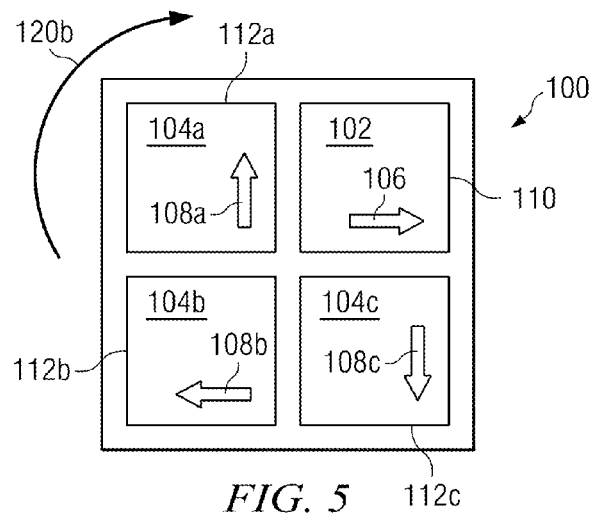
FIGS. 5, 6, and 7 show the lithography mask of FIG. 4 after rotations of the mask to reposition the four patterns when the mask is used to alter material layers of a semiconductor device.
Figure 6:
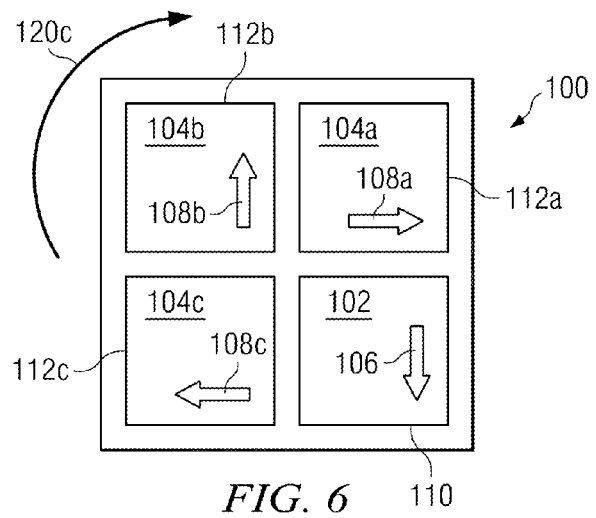
Figure 7:
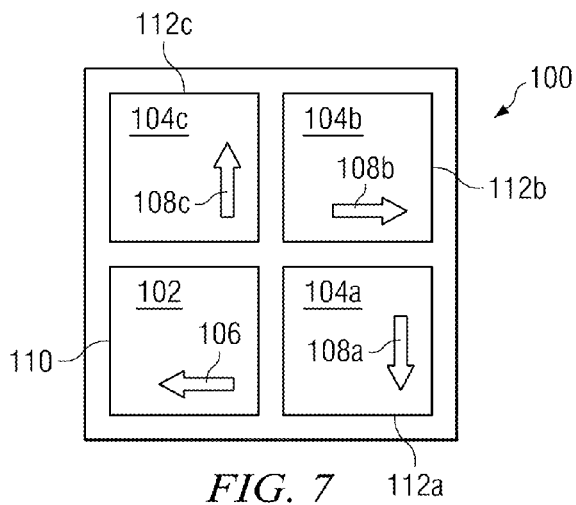

For example, FIG. 4 illustrates a lithography mask 100 that includes four patterns 102, 104a, 104b, and 104c, with each pattern 102, 104a, 104b, and 104c being located in a different quadrant of the lithography mask 100. A quadrant of the lithography mask 100 is selected that will be used for exposure. FIGS. 5, 6, and 7 show the lithography mask 100 after rotations 120a (see FIG. 4), 120b, and 120c of the mask 100 to reposition the four patterns 102, 104a, 104b, and 104c when the patterns 102, 104a, 104b, and 104c are to be used to alter material layers of a semiconductor device 116.

As one example, in FIG. 4, the upper left quadrant of the lithography mask 100 may be selected to be used for exposure, and a first exposure process may be performed on a semiconductor device 116 (not shown in FIGS. 4 through 7) using the first pattern 102 which is positioned in the upper left quadrant. The top 110 of the first pattern 102 is positioned at the upper edge of the lithography mask 100 during the first exposure process, as shown. The lithography mask 100 is then rotated by about 90 degrees as shown in FIG. 4 at 120a, so that the lithography mask 100 is oriented such that the second pattern 104a is now positioned in the upper left quadrant, as shown in FIG. 5. The top 112a of the second pattern 104a is positioned at the upper edge of the lithography mask 100 for the second exposure process, for example. The second position 108a of the second pattern 104a after the rotation 120a comprises substantially the same position and orientation spatially as the first position 106 of the first pattern 102 in the first exposure. A second exposure process may then be performed on a semiconductor device 116 using the second pattern 104a that is in the upper left quadrant.

The lithography mask 100 is rotated 120b again, e.g., by about 90 degrees as shown in FIG. 5 at 120b, so that the third pattern 104b is positioned in the upper left quadrant, as shown in FIG. 6. The third position 108b of the third pattern 104b after the rotation 120b comprises substantially the same position and orientation spatially as the first position 106 of the first pattern 102 in the first exposure, and also comprises substantially the same position and orientation spatially as the second position 108a of the second pattern 104a in the second exposure. A third exposure process may then be performed on the semiconductor device 116 using the third pattern 104b that is in the upper left quadrant. The top 112b of the third pattern 104b is positioned at the upper edge of the lithography mask 100 for the third exposure process.

The lithography mask 100 is rotated 120c again by about 90 degrees as shown in FIG. 6 at 120c, so that the fourth pattern 104c is positioned in the upper left quadrant, as shown in FIG. 7. The fourth position 108c of the fourth pattern 104c after the rotation 120c comprises substantially the same position and orientation spatially as the first position 106 of the first pattern 102 in the first exposure, the second position 108a of the second pattern 104a in the second exposure, and the third position 108b of the third pattern 104b in the third exposure. A fourth exposure process is then performed on the semiconductor device 116 using the fourth pattern 104c that is in the upper left quadrant. The top 112c of the fourth pattern 104c is positioned at the upper edge of the lithography mask 100 for the second exposure process.

Lithography masks and reticles are typically square or rectangular, and thus, embodiments of the present invention are generally implementable as shown in the figures as a square or rectangular mask, with two, three, or four different patterns formed on a single mask 100. However, alternatively, five or more patterns may be implementable on a single mask 100 if a circular mask or a multi-sided mask having five or greater sides are used. The different patterns are oriented on the lithography mask 100 such than when the mask 100 is rotated about a single position (such as the upper left quadrant shown in FIGS. 4 through 7, or the upper portion as shown in FIGS. 1 through 3), the patterns 102, 104, 104a, 104b, and 104c are oriented the same spatially within the lithography system for a plurality of exposure processes.

The lithography masks 100 and patterns 102, 104, 104a, 104b, and 104c formed thereon are preferably rotation-symmetric in accordance with some embodiments of the present invention. For example, in one embodiment, a lithography mask 100 includes a first pattern 102 oriented in a first position 106 and a second pattern 104a oriented in a second position 108a. The lithography mask 100 also includes at least one third pattern 104b for at least one material layer of a semiconductor device 116, each at least one third pattern 104b being oriented in a third position 108b that is differently oriented than the second position 108a, the first position 106, and all of the other third positions 108b (not shown). A plurality of third patterns 104b may be included on a single lithography mask 100, for example.

Figure 8:
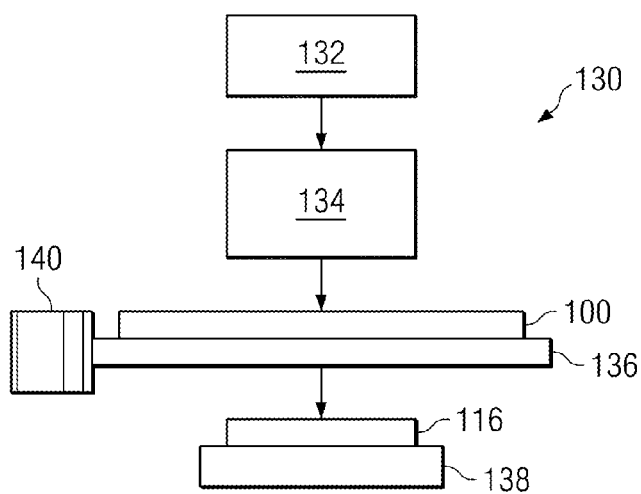
FIG. 8 illustrates a lithography system in accordance with an embodiment of the present invention.

FIG. 8 illustrates a lithography system 130 in accordance with an embodiment of the present invention. The lithography system 130 is adapted to utilize the lithography mask 100 described herein for processing semiconductor devices 116, e.g., for altering or affecting material layers of semiconductor devices 116. Other lithography masks may also be included in a mask set for a single semiconductor device 116 or wafer or for a lot of semiconductor devices 116 or wafers to be processed using the lithography system 130, for example. The lithography system 130 includes an energy source 132 disposed proximate a lens system 134. The lens system 134 is disposed proximate a support 136 or stage for the lithography mask 100. The lithography system 130 includes a support 138 or stage for a semiconductor device 116 or wafer, as shown. The energy source 132 is used to emit energy through the lens system 134 and the lithography mask 100 to a semiconductor device 116 on the support 138 for the semiconductor device 116 during an exposure process. Alternatively, the lithography mask 100 may comprise a reflective mask, for example, not shown.

The lithography system 130 may optionally include a mechanism 140 for rotating the lithography mask 100 by a predetermined amount to position the first pattern 102 or the second pattern 104/104a (and also a third pattern 104b and fourth pattern 140c, if included on the lithography mask 100) of the lithography mask 100 proximate a predetermined region of the lens system 134. Alternatively, the lithography mask 100 may be manually rotated by an operator of the lithography system 130 by a predetermined amount to position the first pattern 102 or the second pattern 104/104a of the lithography mask 100 proximate a predetermined region of the lens system 134, for example, between exposures. Advantageously, the patterns 102, 104, 104a, 104b, and 104c are rotatable to the same region of the lens system 134, the same region of the support 136 for the lithography mask 100, and/or the same region of the support 138 for the semiconductor device 116 for each of a plurality of exposure processes, in some embodiments, for example.

Figure 9:
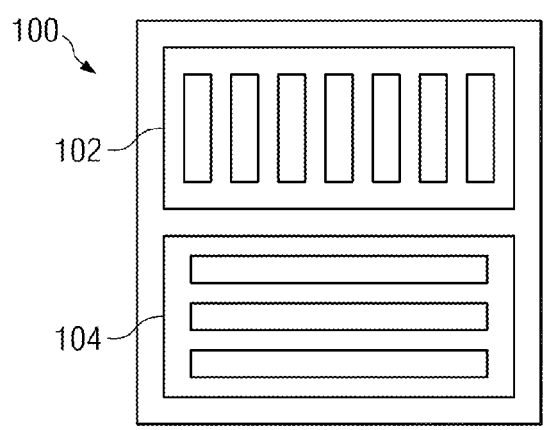
FIG. 9 shows a lithography mask having a first pattern and a second pattern in accordance with an embodiment of the present invention.
Figure 10:
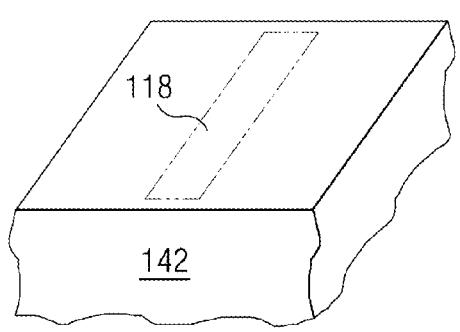
FIG. 10 illustrates a perspective view of an implantation region of a semiconductor device formed by the first pattern of the lithography mask shown in FIG. 9.
Figure 11:
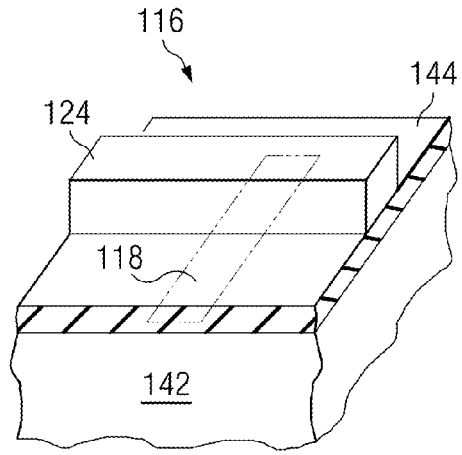
FIG. 11 illustrates a perspective view of a gate conductor of the semiconductor device formed by the second pattern of the lithography mask shown in FIG. 9.

FIGS. 9 through 11 show an example of altering material layers of semiconductor device 116 using a novel lithography mask 100 described herein in accordance with one embodiment of the present invention. A first exposure process is used to form an implantation region and a second exposure process is used to form a gate conductor of the semiconductor device 116. FIG. 9 shows a lithography mask 100 having a first pattern 102 for a plurality of vertically oriented elongated implantation regions and a second pattern 104 for a plurality of horizontally oriented elongated gate conductors in accordance with an embodiment of the present invention.

To manufacture the semiconductor device 116, first, a workpiece 142 is provided, as shown in FIG. 10 in a perspective view. The workpiece 142 may include a semiconductor substrate comprising silicon or other semiconductor materials covered by an insulating layer, for example. The substrate may comprise a compound semiconductor such as GaAs, InP, Si/Ge, or SiC, as examples. The substrate may comprise silicon oxide over single-crystal silicon, for example. The substrate may comprise a silicon-on-insulator (SOI) substrate, as another example. The workpiece 142 may include active components or circuits formed on the substrate, for example, not shown. The workpiece 142 may include conductive layers or other semiconductor elements, such as transistors, diodes, etc., as examples.

In this embodiment, the material layer 118 altered or affected using the lithography mask 100 comprises the workpiece 142, which is implanted with a substance to form an implantation region, which is labeled 118 in FIG. 10. A layer of photoresist (not shown) is formed over the workpiece 142, and the layer of photoresist is patterned using a first exposure process and the first pattern 102 of the lithography mask 100. The layer of photoresist is developed, and the layer of photoresist is used as a mask while a substance is implanted into exposed portions of the workpiece 142, forming an implantation region 118 that has been formed using the first pattern 102 of the lithography mask 100. The implantation region 118 may be formed by implanting impurities such as B, P, or As, as examples, although other materials may also be used. Only one implantation region 118 is shown in the drawings; alternatively, a plurality of implantation regions 118 may be formed within the workpiece 142. The layer of photoresist is then removed, as shown in FIG. 10, which illustrates an implantation region 118 of the semiconductor device 116 in a perspective view, formed by the first pattern 102 of the lithography mask 100 shown in FIG. 9.

The lithography mask 100 is then rotated by 180 degrees to position or orient the second pattern 104 of the lithography mask 100 in the same orientation that the first pattern 102 was in during the first exposure, e.g., at the upper portion of the lithography mask 100 in the example shown in FIG. 9. A gate dielectric material 144 is formed over the workpiece 142, over the top surface of the workpiece 142 and over the implantation region 118, as shown in FIG. 11. The gate dielectric material 144 may comprise a layer of insulating material such as silicon dioxide, silicon nitride, other dielectric materials, or multiple layers or combinations thereof, as examples.

The material layer 124 altered or affected using the lithography mask 100 comprises a gate electrode material, which is patterned to form a gate electrode, which is labeled 124 in FIG. 11. To form the gate electrode, a gate electrode material is formed over the gate dielectric material 144. The gate electrode material may comprise a metal, a semiconductive material, or combinations or multiple layers thereof, for example. A layer of photoresist (not shown) is formed over the gate electrode material. The gate electrode material may comprise a semiconductive material, a metal, or a combination or multiple layers thereof, for example. The layer of photoresist is then patterned using a second exposure process, transferring the second pattern 104 to the layer of photoresist. The layer of photoresist is then developed, and the layer of photoresist is used as an etch mask while exposed portions of the gate electrode material are removed, leaving a gate electrode 124 or gate conductor formed in the gate electrode material by the second pattern 104, as shown in a perspective view in FIG. 11. Only one gate electrode 124 is shown in FIG. 11; alternatively, a plurality of gate electrodes 124 may be formed over the workpiece 142, for example.

Thus, one or more material layers of semiconductor devices 116 may be altered or affected in many ways using the novel lithography masks 100 of embodiments of the present invention. Material layers may be implanted with a substance, or at least a portion of the material layers may be etched away or removed. Alternatively, a substance may be grown on the material layers, or substances may be deposited over the material layers. Material layers of workpieces 142 or semiconductor devices 116 that may be affected using the first patterns 102, second patterns 104/104a, and optionally also the third pattern 104b and fourth patterns 104c of the lithography masks 100 described herein may include photoresists, hard masks, semiconductor substrates, insulating materials, semiconductive materials, conductive materials, or combinations and multiple layers thereof, as examples. Material layers may be altered or affected to form conductive line layers, via layers, contact layers, gate electrode layers, implantation regions, isolation regions, and other features or layers of semiconductor devices 116, as examples.

Figure 12:
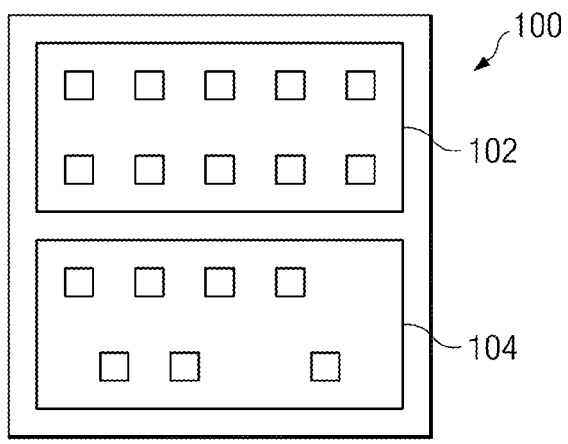
FIG. 12 shows a lithography mask having a first pattern and a second pattern in accordance with another embodiment of the present invention.

As another example, FIG. 12 shows a lithography mask 100 having a first pattern 102 and a second pattern 104 in accordance with another embodiment of the present invention. The first pattern 102 and second pattern 104 are adapted to pattern two via layers V1 and V2 of a semiconductor device 116, as shown in a cross-sectional view in FIG. 13. A first via layer V1 is formed using the first pattern 102 of the lithography mask 100 shown in FIG. 12. The material layer 118 altered or affected using the lithography mask 100 in this embodiment comprises the first via layer V1, which is patterned to form vias of the first via layer V1, which are is labeled 118 in FIG. 13.

Figure 13:
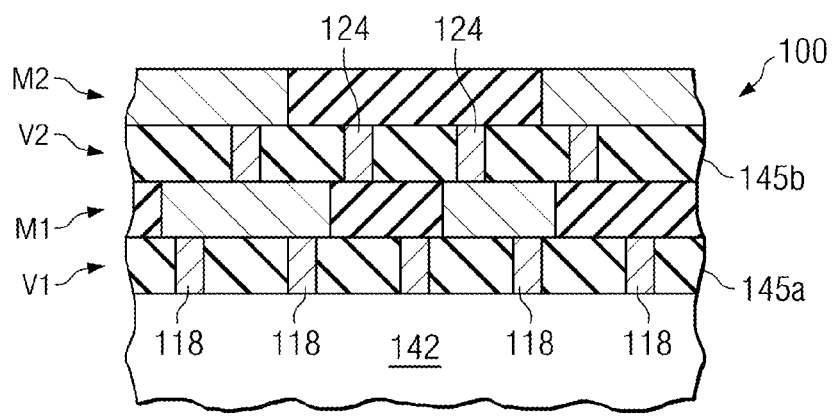
FIG. 13 shows a cross-sectional view of a semiconductor device having two via layers that have been patterned with the first pattern and the second pattern of the lithography mask shown in FIG. 12.

To form the vias 118 from the first pattern 102 of the lithography mask 100, a damascene process may be used, wherein an insulating material layer 145a is formed over the workpiece 142, and the insulating material 145a is patterned using the first pattern 102 of the lithography mask 100 (e.g., using a layer of photoresist which is patterned with the first pattern 102 of the lithography mask 100, not shown). The patterns for the vias 118 in the insulating material 145a are then filled with a conductive material to form the vias 118 in the first via layer V1. Excess portions of the conductive material are removed using an etch process and/or chemical mechanical polishing (CMP) process, forming the vias 118. A first conductive line layer M1 may be formed over the first via layer V1 using a damascene process, as shown in FIG. 13.

The lithography mask 100 is then rotated to place the second pattern 104 in the same position relative to the lithography system 130 (see FIG. 8) equipment as the first pattern 102 was during the first exposure, such as relative to the support 136 for the lithography mask 100, the lens system 134, and/or the support 138 for the semiconductor device 116. A second via layer V2 is formed over the first conductive line layer M1, by depositing an insulating layer 145b. The material layer 124 altered or affected using the lithography mask 100 comprises the second via layer V2 in this embodiment. The second via layer V2 is patterned using the lithography mask 100 to form vias in the second via layer V2, which are labeled 124 in FIG. 13. The second via layer V2 is patterned using a similar method as described for the first via layer V1, using the second pattern 104 of the lithography mask 100 after the lithography mask 100 has been rotated, and a conductive material is formed over the patterned insulating material 145b, filling the patterns in the insulating material 145b and forming vias 124 patterned using the second pattern 104 of the lithography mask 100. Additional conductive line layers such as M2 may be formed over the second via layer V2, as shown. Furthermore, additional via layers and conductive line layers (not shown) may be formed using the novel lithography masks 100 described herein, over conductive line layer M2.

Single damascene and/or dual damascene processes may be used in accordance with embodiments of the present invention to form via layers, contact layers, conductive line layers, and other types of material layers of semiconductor devices 116. Alternatively, subtractive etch processes may also be used to form via layers V1 and V2, contact layers, or conductive line layers M1 and M2. In a subtractive etch process for forming conductive lines, for example, a layer of conductive material is deposited over the workpiece 142, and the layer of conductive material is patterned using a lithography process and a first pattern 102 or a second pattern 104 (rotated) of the lithography mask 100, forming the conductive lines. An insulating material is then deposited over the patterned conductive material, and any excess insulating material is removed from over the conductive lines.

In some embodiments, two or more material layers of semiconductor devices 116 are affected or altered using the novel lithography masks 100. In some embodiments, two or more sequential material layers of a semiconductor device 116 may be affected, e.g., material layers that are sequentially deposited and processed, and that are adjacent or proximate one another. In other embodiments, non-sequential material layers may be affected using the novel lithography masks 100, for example. In other embodiments, a single material layer may be affected with two or more patterns 102, 104, 104a, 104b, or 104c.

Figure 14:
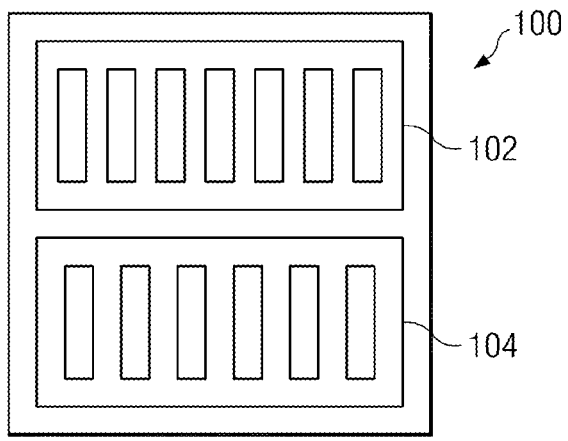
FIG. 14 illustrates another lithography mask having a first pattern and a second pattern in accordance with yet another embodiment of the present invention.
Figure 15:
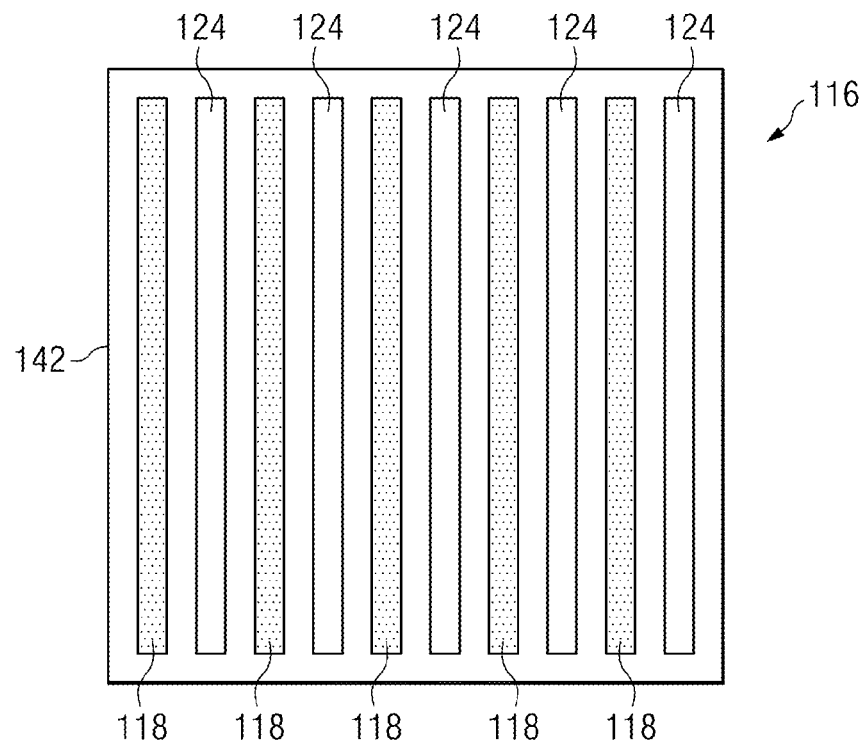
FIG. 15 shows a single layer of a semiconductor device that has been patterned using a double patterning technique using the first and second patterns of the lithography mask shown in FIG. 14.

FIG. 14 illustrates another lithography mask 100 having a first pattern 102 and a second pattern 104 that is oriented differently than the first pattern 102 in accordance with yet another embodiment of the present invention. FIG. 15 shows a single material layer 118/124 (e.g., conductive lines are labeled 118 and 124 in FIG. 15) of a semiconductor device 116 that has been patterned using a double patterning technique, using the first pattern 102 and second pattern 104 (rotated) of the lithography mask 100 shown in FIG. 14. Every other conductive line 118 and 124 is patterned with the first pattern 102 and the second pattern 104. For example, conductive lines 118 of the semiconductor device 116 shown in FIG. 15 are patterned using the first pattern 102, the lithography mask 100 is rotated, and conductive lines 124 are patterned using the second pattern 104 of the lithography mask 100 shown in FIG. 14. The first and second patterns 102 and 104 may be used to pattern a single layer of resist (not shown), or the first pattern 102 may be used to pattern a first layer of resist, the first pattern is transferred to a hard mask (also not shown), a second layer of resist is formed, the second pattern 104 is used to pattern the second layer of resist, and the second pattern is transferred to the hard mask. The hard mask may then be used to affect or alter a material layer of the semiconductor device 116 underlying the hard mask.

A lithography mask 100 such as the one shown in FIG. 14 may also be used to pattern conductive lines in conductive line layers M1 and M2 shown in FIG. 13, for example. The first pattern 102 may be used to pattern conductive lines in layer M1, and after rotating the lithography mask 100, the second pattern 104 may be used to pattern conductive lines in layer M2, as another example.

Figure 16:
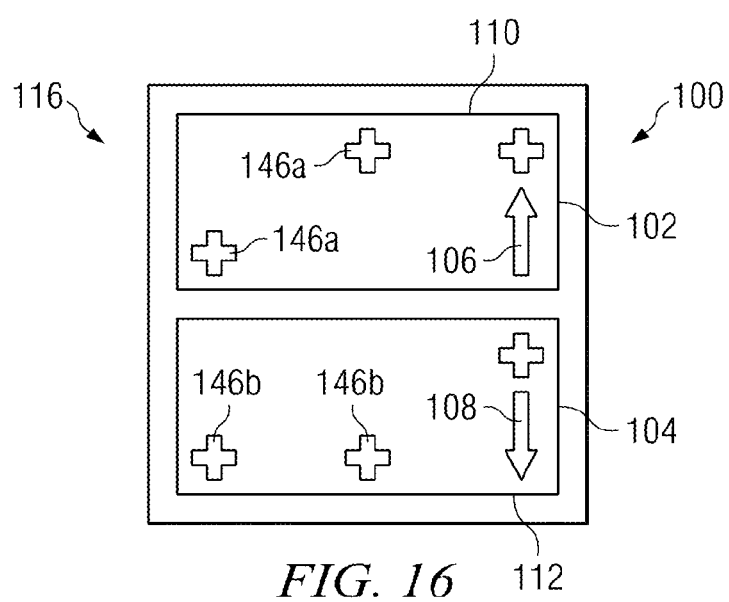
FIG. 16 shows alignment marks of the first pattern and the second pattern of a lithography mask in accordance with an embodiment of the present invention.

In some embodiments, in the design of the lithography masks 100, alignment marks may need to be altered or additional alignment marks may be required proximate the patterns 102, 104, 104a, 104b, and 104c, due to the rotated orientation of the patterns 104, 104a, 104b, and 104c on the mask 100. For example, FIG. 16 illustrates a top view of a lithography mask 100 that includes alignment marks 146a and 146b within the first pattern 102 and second pattern 104, respectively. It may be desirable in some applications to have the same pattern of alignment marks 146a and 146b after rotating the mask 100 to position the first and second patterns 102 and 104 in a predetermined region of the lithography system 130 for exposure, e.g., in the upper region of the mask 100.

For example, in some embodiments, a first set of alignment marks 146a may be formed proximate the first pattern 102, and a second set of alignment marks 146b may be formed proximate the second pattern 104. The first set of alignment marks 146a and the second set of alignment marks 146b may comprise substantially the same pattern, as shown in FIG. 16. However, the first set of alignment marks 146a is oriented in the first position 106, and the second set of alignment marks 146b is oriented in the second position 108.

Embodiments of the present invention are shown and described herein in specific contexts, e.g., such as for forming implantation regions and for patterning gate conductors, vias, and conductive lines. The invention may also be applied, however, to the patterning of other features of semiconductor devices 116. Embodiments of the present invention may be particularly useful for features having a repeating pattern and comprising small sizes, e.g., reaching the resolution limits of the lithography system and processes used to pattern the device features. Embodiments of the invention may be implemented in many semiconductor device 116 applications, such as memory devices, logic devices, or mixed signal devices, as examples, although other types of semiconductor devices, integrated circuits, and circuitry may be fabricated using the novel embodiments of the present invention described herein.

The lithography masks 100 used to alter material layers of semiconductor devices 116 described herein may comprise bright field binary masks, attenuating masks, dark field masks, alternating phase shift masks, or other types of masks, as examples, not shown. The first patterns 102, second patterns 104/104a, third patterns 104b, and fourth patterns 104c may include small protrusions or serifs along their length or at their ends for optical proximity correction (OPC) to compensate at least partially for diffraction effects in the lithography process and system 130, for example, not shown.

1:1 lithography systems 130 or lithography systems 130 that comprise a reduction factor may be used to alter material layers of semiconductor devices 116 described herein, such as a 4:1 reduction factor, as an example, although other reduction factors may also be used. The lithography systems 130 used to alter material layers of semiconductor devices 116 described herein may comprise lithography systems that utilize ultraviolet (UV) or extreme UV (EUV) light, optical lithography systems, x-ray lithography systems, interference lithography systems, or immersion lithography systems, as examples.

Embodiments of the present invention described herein comprise novel lithography masks 100 and systems 130, and novel methods of altering and affecting material layers of semiconductor devices 116. Embodiments of the present invention also include methods of manufacturing semiconductor devices 116 and semiconductor devices 116 altered using the novel methods described herein, for example.

Embodiments of the present invention also include methods of manufacturing lithography masks 100. For example, a layout for at least one material layer of a semiconductor device 116 may be designed, and a first pattern 102 for a first portion of the layout may be determined. A second pattern 104 for a second portion of the layout is then determined, and a lithography mask 100 is then fabricated that includes the first pattern 102 oriented in the first position 106 and a second pattern 104 oriented in the second position 108.

In the embodiment shown in FIGS. 4 through 7, a third pattern 104b may be determined for a third portion of the layout, and fabricating the lithography mask 100 may include including the third pattern 104b oriented in a third position 108b that is different than the first position 106 and the second position 108a. A fourth pattern 104c may also be determined for a fourth portion of the layout, and fabricating the lithography mask 100 may further include including the fourth pattern 104c on the lithography mask 100 oriented in a fourth position 108c that is different than the first position 106, the second position 108a, and the third position 108b, for example.

Advantages of embodiments of the present invention include providing novel lithography masks 100 for semiconductor device 116 processing and manufacturing. The rotatable lithography masks 100 result in increased yields and improved reliability of semiconductor devices 116, due to reduced overlay signatures. Overlapping images of lithography processes using the lithography masks 100 have a low systematic overlay, e.g., with respect to stage and lens overlay signatures. Critical dimension (CD) control is also improved by embodiments of the present invention. Including multiple patterns 102, 104, 104a, 104b, and 104c on the lithography masks 100 results in reduced manufacturing costs, because fewer lithography masks are required.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography mask, comprising:
a first pattern for a first material layer of at least one die, the first pattern being oriented in a first position;
a second pattern for a second material layer of the at least one die, the second pattern being oriented in a second position, the second position being different than the first position; and
a first set of alignment marks within the first pattern and a second set of alignment marks within the second pattern.

2. The lithography mask according to claim 1, wherein the first material layer and the second material layer are the same material layer.

3. The lithography mask according to claim 1, wherein the first set of alignment marks of the first pattern is unsymmetrical to the second set of alignment marks of the second pattern.

4. The lithography mask according to claim 1, further comprising a third pattern for a third material layer of the at least one die, the third pattern being oriented in a third position that is differently oriented than the first position and the second position.

5. The lithography mask according to claim 4, wherein the third material layer is the same material layer as the first material layer and the second material layer.

6. The lithography mask according to claim 4, further comprising a fourth pattern for a fourth material layer of the at least one die, the fourth pattern being oriented in a fourth position that is differently oriented than the first position, the second position and the third position.

7. The lithography mask according to claim 6, wherein the fourth material layer is the same material layer as the first material layer, the second material layer, and the third material layer.

8. A method of making a semiconductor device using the lithography mask of claim 1, the method comprising:
- providing a semiconductor wafer; and
- irradiating the semiconductor wafer through the lithography mask of claim 1 to alter the material layer of the semiconductor wafer.

9. A lithography mask, comprising:
- a plurality of patterns for patterning a material layer on a semiconductor device; and
- a plurality of alignment marks, wherein each pattern of the plurality of patterns comprises a different orientation, wherein each pattern comprises an alignment mark proximate the pattern, and wherein the lithography mask is configured to pattern the material layer.

10. The lithography mask according to claim 9, wherein the lithography mask is 90 degrees rotation-symmetric.

11. The lithography mask according to claim 9, wherein the lithography mask is 180 degrees rotation-symmetric.

12. A method of making the semiconductor device using the lithography mask of claim 9, the method comprising:
- providing a semiconductor wafer; and
- irradiating the semiconductor wafer through the lithography mask of claim 9 to alter the material layer of the semiconductor wafer.

13. The lithography mask according to claim 9, wherein the alignment mark is located within each pattern.

14. The lithography mask according to claim 9, wherein the plurality of alignment marks are unsymmetrical.

15. A lithography mask, comprising:
- a plurality of patterns for patterning a single material layer on a semiconductor device, each pattern of the plurality of patterns having a different orientation, wherein the lithography mask is configured to expose the single material layer, and wherein the lithography mask is rotatable.

16. The lithography mask according to claim 15, wherein the lithography mask is 90 degrees rotation-symmetric.

17. The lithography mask according to claim 15, wherein the lithography mask is 180 degrees rotation-symmetric.

18. A method of making the semiconductor device using the lithography mask of claim 15, the method comprising:
- providing a semiconductor wafer; and
- irradiating the semiconductor wafer through the lithography mask of claim 9 to alter the single material layer of the semiconductor wafer.

19. A lithography mask, comprising:
- a first pattern for a material layer of at least one die, the first pattern comprising a first orientation; and
- a second pattern for the material layer of the at least one die, the second pattern comprising a second orientation, the second orientation being different than the first orientation,
- wherein the lithography mask is configured to be rotatable.

20. The lithography mask according to claim 19, further comprising a first set of alignment marks proximate the first pattern and a second set of alignment marks proximate the second pattern, the first set of alignment marks and the second set of alignment marks comprising substantially the same pattern.

21. The lithography mask according to claim 19, wherein the second pattern is oriented about 180 degrees from the first pattern.

22. The lithography mask according to claim 19, further comprising a third pattern for the material layer of the at least one die, the third pattern having a third orientation that is differently oriented than the first orientation and the second orientation.

23. The lithography mask according to claim 22, further comprising a fourth pattern for the material layer of the at least one die, the fourth pattern comprising a fourth orientation that is differently oriented than the first orientation, the second orientation and the third orientation.

24. A method of making a semiconductor device using the lithography mask of claim 19, the method comprising:
- providing a semiconductor wafer; and
- irradiating the semiconductor wafer through the lithography mask of claim 19 to alter the material layer of the semiconductor wafer.

\* \* \* \* \*